Figure 1:
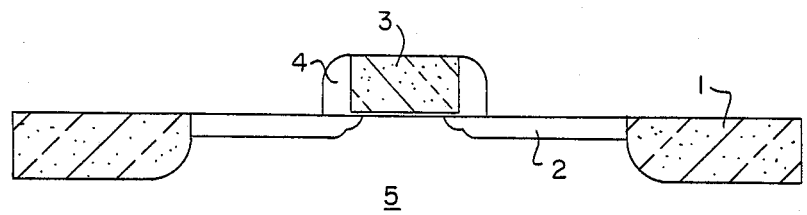

United States Patent [19]

Wu

[11] Patent Number: 4,908,332
[45] Date of Patent: Mar. 13, 1990

[54] PROCESS FOR MAKING METAL-POLYSILICON DOUBLE-LAYERED GATE

[75] Inventor: Neng-Wei Wu, Hsin-Chu, Taiwan

[73] Assignee: Industrial Technology Research Institute, Taiwan, Taiwan

[21] Appl. No.: 347,359

[22] Filed: May 4, 1989

[51] Int. Cl.$^4$ .......................................... H01L 21/283
[52] U.S. Cl. .................................... 437/192; 437/193; 437/194; 437/41; 437/228
[58] Field of Search ................ 437/192, 193, 194, 40, 437/41, 44, 45, 179, 200, 201; 357/71

[56] References Cited

U.S. PATENT DOCUMENTS 4,514,233  4/1985  Kawabuchi ............................ 437/41
4,616,401  10/1986  Takeuchi .............................. 437/192
4,728,620  3/1988  Jench ................................... 437/41
4,755,478  7/1988  Abernathey et al. ................. 437/41

Primary Examiner—Brian E. Hearn
Assistant Examiner—T. N. Quach
Attorney, Agent, or Firm—Darby & Darby

[57] ABSTRACT

A process for reducing gate sheet resistance in VSLI devices employs planarization and metal refilling to produce a gate of layers of polysilicon and pure metal. The polysilicon underlayer maintains the characteristics of a polysilicon gate and the metal layer reduces the gate sheet resistance. The process includes the etching back of the planarized dielectric (6) to expose the top surface of the polysilicon gate (3), the etching of the polysilicon to form a groove, and the filling of the groove with a metal, e.g. W, by selective or blanket CVD.

6 Claims, 2 Drawing Sheets

PROCESS FOR MAKING METAL-POLYSILICON DOUBLE-LAYERED GATE

FIELD OF THE INVENTION

This invention relates to a process for reducing the gate sheet resistance of VSLI devices.

BACKGROUND OF THE INVENTION

There is currently a great interest in the provision of small device structures, largely as a result of the increasing requirements for higher packing density for VSLI integrated circuits. As the dimensions of the structure of the device shrinks in order to achieve high packing density, the sheet resistance associated with the gate increases. This increased sheet resistance contributes to RC propagation delays.

Polysilicon has been the dominant interconnect material since it has a low threshold voltage and also provides good step coverage with uniform and economical deposition of the layers. Its high temperature characteristics aid in stability during annealing, after the etching and ion implantation steps. Due to the problem of high sheet resistance of the material, however, various methods have been tried to find other interconnect materials with lower resistance.

One of the primary considerations is obtaining a material with high electrical conductivity and low ohmic contact resistance. The material should also have electromigration resistance and be stable in final metallization in contact with silicon and/or oxide. These characteristics must be maintained throughout the high temperature processing.

Presently, a polycide structure composed of polysilicon and a transition metal silicide appears to meet these requirements. Because of its relatively high conductivity, polycide has been selected as a material for VSLI devices.

Since the channel length of the device shrinks continuously toward the submicron region, however, the sheet resistance of polycide cannot be reduced to meet higher performance requirements.

A gate interconnect of pure refractory metal still seems attractive since refractory metal has the important advantage of very low resistivity compared with polysilicon and silicides. It cannot, however, withstand high temperature oxidation to which it is exposed during processing. In addition, some chemical reagents utilized to clean the wafers during processing cannot be tolerated by most refractory metals.

U.S. Pat. No. 4,755,478, Abernathy et al, discloses a method for making a planarized gate stack having a low sheet resistance, the method including disposing a gate mask on the top of a patterned polysilicon layer. Subsequently the insulating layer is planarized to expose the upper surface of the gate mask, which is then etched to expose the polysilicon layer, and a conductive material, primarily a refractory metal, is grown to provide a metal strapped polysilicon gate electrode.

U.S. Pat. No. 4,514,233, Kawabuchi, discloses a method for reducing the resistance of the gate electrode including the steps of forming a silicon nitride film, doping the source and drain regions using tee silicon nitride as a mask, and removing the silicon nitride to expose the gate electrode for final aluminum wiring connections.

U.S. Pat. No. 4,616,401, Takeuchi, discloses a method wherein conductive material films are formed on the gate electrode as well as on the source and drain regions.

U.S. Pat. No. 4,676,867, Elkins et al, discloses a method for applying a first layer of a dielectric material over a metal layer using a layer of spin-on-glass for planarization, and applying a second layer of dielectric over the first dielectric layer before defining the electrode paths.

U.S. Pat. No. 4,753,709, Welch et al, discloses a method for etching contact paths of different depth utilizing a silicide film which acts as an etch stop, without etching through any of the polysilicon layers.

U.S. Pat. No. 4,780,429, Roche et al, discloses a method for forming a gate electrode by a first layer of metallic silicide followed by a second layer of metallic silicide to be used as source and drain electrodes, without forming a composite gate electrode.

SUMMARY OF THE INVENTION

The invention is directed to a microfabrication process for producing a gate interconnect consisting of a polysilicon layer and a metal layer. The invention provides a process for depositing the metal layer after all of the thermal processing has been completed in order to avoid oxidation and silicidation between the metal and the polysilicon layer thereunder. In this way, polysilicon, the underlayer of the gate interconnect, can maintain the electrical properties of a conventional gate. The pure metal that is placed on top of the polysilicon layer provides a low resistance path for the gate interconnect.

BRIEF FIGURE DESCRIPTION

In order that the invention may be more clearly understood, it will now be disclosed in greater detail with reference to the accompanying drawings, wherein:

FIG. 1 illustrates the structure of a typical device after junction formation with a recess isolation structure; and FIGS. 2-6 are cross-sectional views representing sequentially the preferred process steps for fabricating a metal-polysilicon double-layer gate interconnect structure according to the present invention.

DETAILED DISCLOSURE OF THE INVENTION

FIG. 1 illustrates the structure of a typical device fabricated on a silicon substrate 5. As an example, for NMOS integrated circuits the substrate can be p-silicon having a resistivity of 1 to 20 ohm-cm. A typical CMOS starting structure can be a p-silicon or p-epitaxial layer on an n substrate.

First, an isolation recess structure 1 having a low defect density beneath the field oxide edge is formed on the substrate 5 by local thermal oxidation. Then polysilicon is deposited by low pressure chemical vapor deposition (LPCVD) to a thickness between 350 and 500 nanometers,, and is doped by $POCl_3$ diffusion or ion implantation. After lithography and polysilicon etching for defining a gate interconnect 3, a light implantation and oxide sidewall spacer formation 4 are formed to implement lightly doped drain (LDD) structure. This structure can be formed, for example, in accordance with the technology disclosed in "Fabrication of High Performance LDDFET's with Oxide Sidewall-Spacer Technology", Paul J. Tsang, IEEE Transaction on Electron Device, Vol. 29, No. 4, April 1982. The light implantation can be applied to NMOS only or to both NMOS and PMOS. The spacer is formed by CVD oxide deposition followed by reactive ion etching (RIE), which has highly anisotropic etching properties, to preserve oxide in the corner of the polysilicon gate interconnect edge. The source and drain 2 are formed by light implantation and heavy, respectively, and are self aligned with respect to the gate to have an overlap capacitance between the gate and source/drain that has an optimum value.

Figure 2:
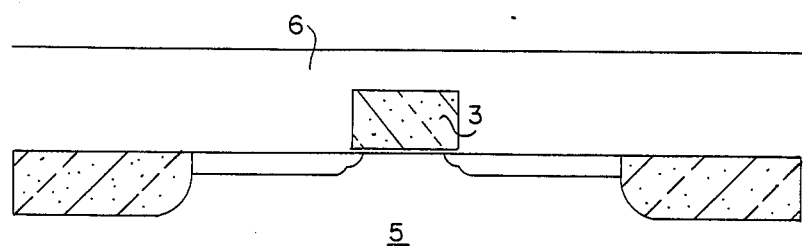

Referring now to FIG. 2, after forming the source and drain 2, a planarized dielectric layer 6 is deposited on the substrate. This planarized dielectric layer can be a spin-on-glass (SOG) layer which has good planarization characteristics, on top of a CVD oxide layer. Another way to form this planarized layer is to coat a photoresist layer on top of a thick CVD layer and etch the layer back by reactive ion etching with an appropriate conventional etching process. This technique is known as "etchback planarization" technology.

Figure 3:
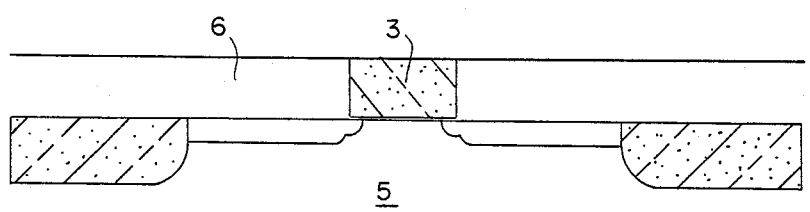

As illustrated in FIG. 3, the planarized layer 6 is etched back to a thickness that is the same as that of the polysilicon gate interconnect 3. The purpose of this step is to expose the polysilicon gate interconnect to the surface of the structure.

Figure 4:
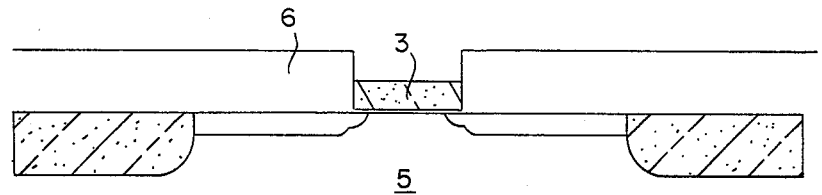

Referring now to FIG. 4, the polysilicon gate interconnect 3 is etched to a determined thickness to form a groove above the polysilicon interconnect. The provision of this groove is preparatory to metal filling in the next step.

Figure 5:
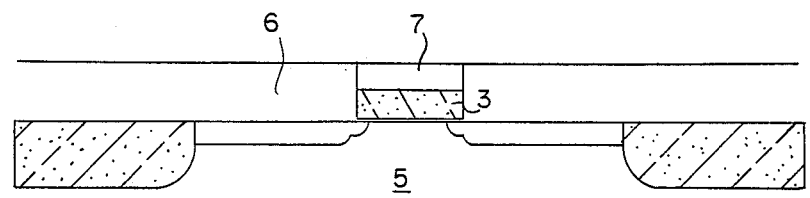

As illustrated in FIG. 5, the groove of FIG. 4 is filled with a metal 7 that abuts the polysilicon gate interconnect to form a metal-polysilicon double-layered gate interconnect. The metal filling can be effected by any of several contact path filling techniques. Selective chemical vapor deposition technology which is capable of depositing metal onto polysilicon rather than oxide may be employed. Alternatively, etchback technology may be used to first deposit a blanket metal onto the wafer by chemical vapor deposition to obtain a very uniform film across the step, and subsequently, after etchback of the metal by plasma etching, to fill the groove with the remaining metal. Since the metal has very low resistivity, this double-layered gate has a sheet resistance lower than most polycide (polysilicon-silicide) or salicide (self-aligned-silicide) gates. For example, in a CVD tungsten layer 300 nanometers thick having a resistivity of 10 ohm-cm, the sheet resistance can easily be reduced to 0.4 ohm-per-square, compared with 1–2 ohm-per-square for titanium salicide and 2–3 ohm-per-square for tungsten polycide. Therefore, the metal layer in the double-layered gate acts as a very low resistance current path and the electrical properties of the MOS transistor are still preserved by the polysilicon under layer.

Figure 6:
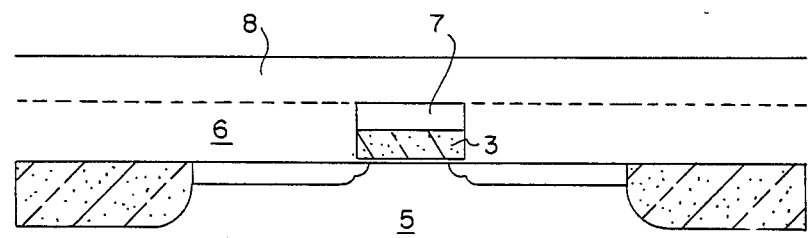

Referring to FIG. 6, the dielectric layer 8 is deposited onto the wafer to isolate the gate interconnect. High temperature processing is not necessary for planarization since the structure is already planarized after the metal filling step.

The present invention does not require the process steps of the method of U.S. Pat. No. 4,514,233. U.S. Pat. No. 4,616,401 does not disclose a method including the step of forming a polysilicon gate groove solely for the purpose of metal refilling, and this reference also does not planarize the gate electrode. U.S. Pat. No. 4,676,867 does not provide for the sheet resistance reduction of the gate electrode employing a composite gate structure, as in the present invention. The present invention is distinguished in the method steps and is concerned with the solution of a different problem than that of U.S. Pat. No. 4,703,709. U.S. Pat. No. 4,780,429 does not disclose the forming of a composite gate electrode, as in the present invention.

The present invention is directed to a process that is simpler than that of U.S. Pat. No. 4,755,478, since the invention does not require the steps of forming and removing the gate mask, and, contrary to the process of the reference, in the present invention the planarized dielectric layer is either deposited by spin-on-glass or photoresist etch back steps.

While the invention has been disclosed and described with reference to a single embodiment, it will be apparent that variations and modification may be made therein, and it is therefore intended in the following claims to cover each such variation and modification as falls within the true spirit and scope of the invention.

What is claimed is:

1. A process for forming a double-layered gate interconnect on a substrate, comprising:
   (1) forming a recess isolation structure on the substrate;
   (2) forming a polysilicon gate interconnect layer on the substrate;
   (3) forming source and drain regions on the substrate;
   (4) depositing a planarized dielectric layer on the gate interconnect and the source and drain regions;
   (5) etching back the planarized dielectric layer to the expose top surface of the polysilicon gate interconnect layer;
   (6) partially etching the polysilicon gate interconnect to form a groove; and
   (7) filling the groove with a metal gate interconnect layer to abut the polysilicon gate interconnect layer to form a double-layered gate interconnect.

2. The process for forming a double-layered gate interconnect of claim 1 comprising depositing the planarized dielectric layer by spin-on-glass coating.

3. The process for forming a double-layered gate interconnect of claim 1 comprising depositing the planarized dielectric layer by photoresist etchback.

4. The process for forming a double-layered gate interconnect of claim 1 comprising filling the metal gate interconnect layer in the groove by selective chemical vapor deposition.

5. The process for forming a double-layered gate interconnect of claim 1 comprising filling the metal gate interconnect layer in the groove by etchback after blanket chemical vapor deposition.

6. The process for forming a double-layered gate interconnect of claim 1 wherein the metal gate interconnect is made of a material selected from the group consisting of Tungsten (W), Titanium (Ti), Tantalum (Ta), Cobalt (Co), Chromium (Cr), Platinum (Pt) and Aluminum (Al).

* * * * *